US011469306B2

(12) United States Patent
Lee et al.

(10) Patent No.: US 11,469,306 B2
(45) Date of Patent: Oct. 11, 2022

(54) SEMICONDUCTOR DEVICE HAVING A GATE ELECTRODE IN A TRENCH

(71) Applicant: SAMSUNG ELECTRONICS CO., LTD., Suwon-si (KR)

(72) Inventors: Jee-Sun Lee, Seoul (KR); Dong Soo Woo, Seoul (KR); Nam Ho Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/995,044

(22) Filed: Aug. 17, 2020

(65) Prior Publication Data

US 2021/0126098 A1    Apr. 29, 2021

(30) Foreign Application Priority Data

Oct. 24, 2019   (KR) ........................ 10-2019-0132649

(51) Int. Cl.
*H01L 29/423*   (2006.01)
*H01L 27/108*   (2006.01)

(52) U.S. Cl.
CPC .... *H01L 29/4236* (2013.01); *H01L 27/10823* (2013.01); *H01L 27/10876* (2013.01); *H01L 27/10891* (2013.01)

(58) Field of Classification Search
CPC ......... H01L 27/10823; H01L 27/10876; H01L 27/10891
See application file for complete search history.

(56) References Cited

U.S. PATENT DOCUMENTS

| 7,554,149 | B2 | 6/2009 | Kim | |
|---|---|---|---|---|
| 8,835,242 | B2 | 9/2014 | Ko et al. | |
| 9,349,737 | B2 | 5/2016 | Pulugurtha et al. | |
| 2012/0039104 | A1* | 2/2012 | Lin | H01L 29/66666 |
| | | | | 365/63 |
| 2014/0070291 | A1* | 3/2014 | Song | H01L 27/10855 |
| | | | | 257/296 |
| 2017/0012098 | A1* | 1/2017 | Park | H01L 27/10805 |
| 2018/0190771 | A1* | 7/2018 | Lin | H01L 29/4236 |
| 2018/0277546 | A1* | 9/2018 | Wang | H01L 29/4236 |
| 2018/0286742 | A1* | 10/2018 | Nagai | H01L 21/823481 |
| 2018/0323190 | A1* | 11/2018 | Feng | H01L 27/10823 |
| 2019/0067120 | A1 | 2/2019 | Ching et al. | |
| 2020/0111796 | A1* | 4/2020 | Nourbakhsh | H01L 29/66666 |
| 2020/0227269 | A1* | 7/2020 | Liu | H01L 29/6659 |

FOREIGN PATENT DOCUMENTS

KR    10-0826985    5/2008

* cited by examiner

*Primary Examiner* — Marcos D. Pizarro
*Assistant Examiner* — William Henry Anderson
(74) *Attorney, Agent, or Firm* — F. Chau & Associates, LLC

(57) ABSTRACT

A semiconductor device including a substrate having isolation films and active regions that are defined by the isolation films. The active regions extend in a first direction. A first trench is disposed on the substrate. Second trenches are disposed in the active regions. A filling film is disposed in the first trench. First gate patterns are disposed on the filling film in the first trench. Second gate patterns are disposed in the second trenches. The second gate patterns extend in a second direction that is different from the first direction. The filling film includes at least one material selected from a semiconductor material film and a metal.

19 Claims, 19 Drawing Sheets

SEMICONDUCTOR DEVICE HAVING A GATE ELECTRODE IN A TRENCH

CROSS-REFERENCE TO RELATED APPLICATION

This application claims priority under 35 U.S.C. § 119 to Korean Patent Application No. 10-2019-0132649, filed on Oct. 24, 2019 in the Korean Intellectual Property Office, the disclosure of which is incorporated by reference in its entirety herein.

TECHNICAL FIELD

Exemplary embodiments of the present inventive concepts relate to a semiconductor device.

DISCUSSION OF RELATED ART

A buried channel array transistor (BCAT) includes a gate electrode buried in a trench. A BCAT may overcome the short channel effect of a dynamic random access memory (DRAM) structure.

As semiconductor devices have become highly integrated, individual circuit patterns for increasing the number of semiconductor devices in a Oven area have become increasingly sophisticated. The design rule of elements of each semiconductor device has decreased. As the integration density of a DRAM device increases, the amount of charge that each capacitor may be charged with gradually decreases. Therefore, it would be beneficial to increase the amount of charm stored in each capacitor of a DRAM device and to improve leakage characteristics.

SUMMARY

Exemplary embodiments of the present inventive concepts provide a semiconductor device having improved reliability and performance.

According to an exemplary embodiment of the present inventive concepts, a semiconductor device includes a substrate having isolation films and active regions that are defined by the isolation films. The active regions extend in a first direction. A first trench is disposed on the substrate. Second trenches are disposed in the active regions. A filling film is disposed in the first trench. First gate patterns are disposed on the filling film in the first trench. Second gate patterns are disposed in the second trenches. The second gate patterns extend in a second direction that is different from the first direction. The filling film includes at least, one material selected from a semiconductor material film and a metal.

According to an exemplary embodiment of the present inventive concepts, a semiconductor device includes a first trench disposed in a substrate and having a first width in a first direction. Second trenches are disposed in the substrate and have a second width in the first direction. The second width is smaller than the first width. Third trenches are disposed in the substrate and have a third width in the first direction. The third width is smaller than the second width. A first isolation film fills the first trench. A second isolation film fills the second trenches. The second isolation film includes at least one material selected from a semiconductor material film and a metal. An uppermost surface of the second isolation film has a first height with respect to a bottom surface of the second isolation film. A third isolation film fills the third trenches. An uppermost surface of the third isolation film has a third height with respect to a bottom surface of the second isolation film. An uppermost surface of a portion of the substrate between the second isolation film and the third isolation film has a second height with respect to the bottom surface of the second isolation film. Wordlines extend in the first direction over the second and third isolation films and extend at least partially over the first isolation film. The first height is less than or equal to the second height and the first height is greater than the third height.

According to an exemplary embodiment of the present inventive concepts, a semiconductor device includes a first trench disposed in a substrate and having a first width in a first direction. Second trenches are disposed in the substrate and have a second width in the first direction. The second width is smaller than the first width. Third trenches are disposed in the substrate and have a third width in the first direction. The third width is smaller than the second width. A first isolation film fills the first trench. A second isolation film fills the second trenches. An uppermost surface of the second isolation film has a first height with respect to a bottom surface of the second isolation film. The first isolation film and second isolation film include different materials from each other. A third isolation film fills the third trenches. Uppermost surfaces of the first and third isolation films have a third height with respect to the bottom surface of the second isolation film. An uppermost surface of portion of the substrate between the second isolation film and the third isolation film has a second height with respect to the bottom surface of the second isolation film. Wordlines extend in the first direction over the second isolation film and the third isolation film and extend in part over the first isolation film. The first height is less than or equal to the second height and the first height is greater than the third height.

However, exemplary embodiments of the present inventive concepts are not restricted to those set forth herein. The above and other exemplary embodiments of the present inventive concepts will become more apparent to one of ordinary skill in the art to which the present disclosure pertains by referencing the detailed description of exemplary embodiments of the present inventive concepts given below.

BRIEF DESCRIPTION OF THE DRAWINGS

The above and other embodiments and features of the present inventive concepts will become more apparent by describing in detail exemplary embodiments thereof with reference to the attached drawings.

DETAILED DESCRIPTION OF EXEMPLARY EMBODIMENTS

Semiconductor devices according to some exemplary embodiments of the present inventive concepts will hereinafter be described with reference to FIGS. 1 through 12B, taking dynamic random access memories (DRAMs) as an example. However, exemplary embodiments of the present inventive concepts are not limited thereto and the semiconductor device may be various other semiconductor devices.

Figure 1:
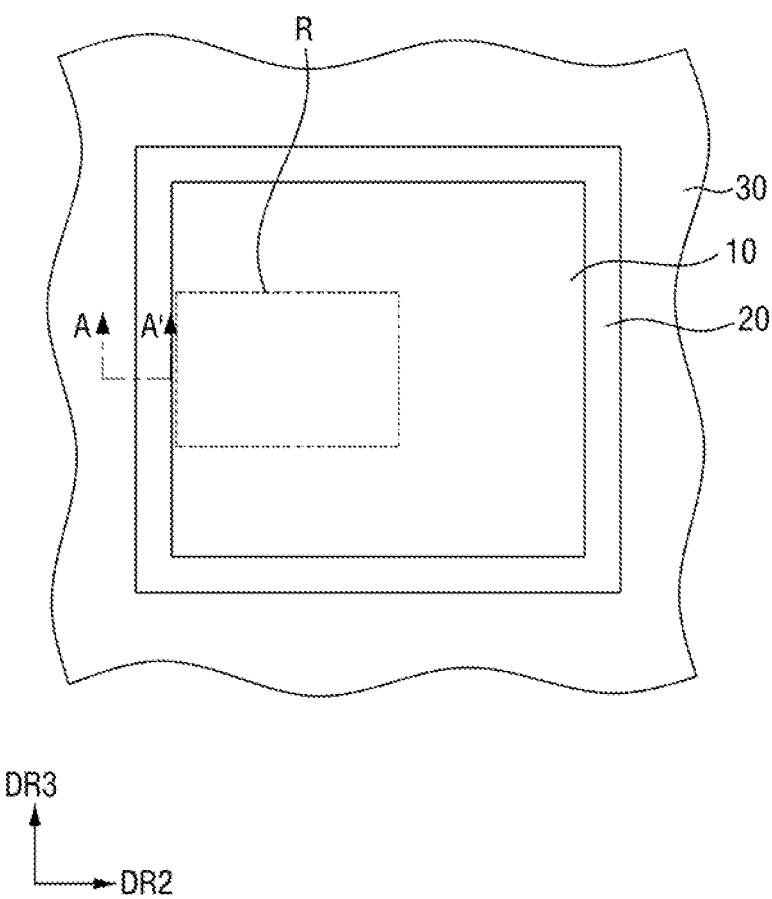
FIG. 1 is a plan view of a semiconductor device according to some embodiments of the present inventive concepts.
Figure 2:
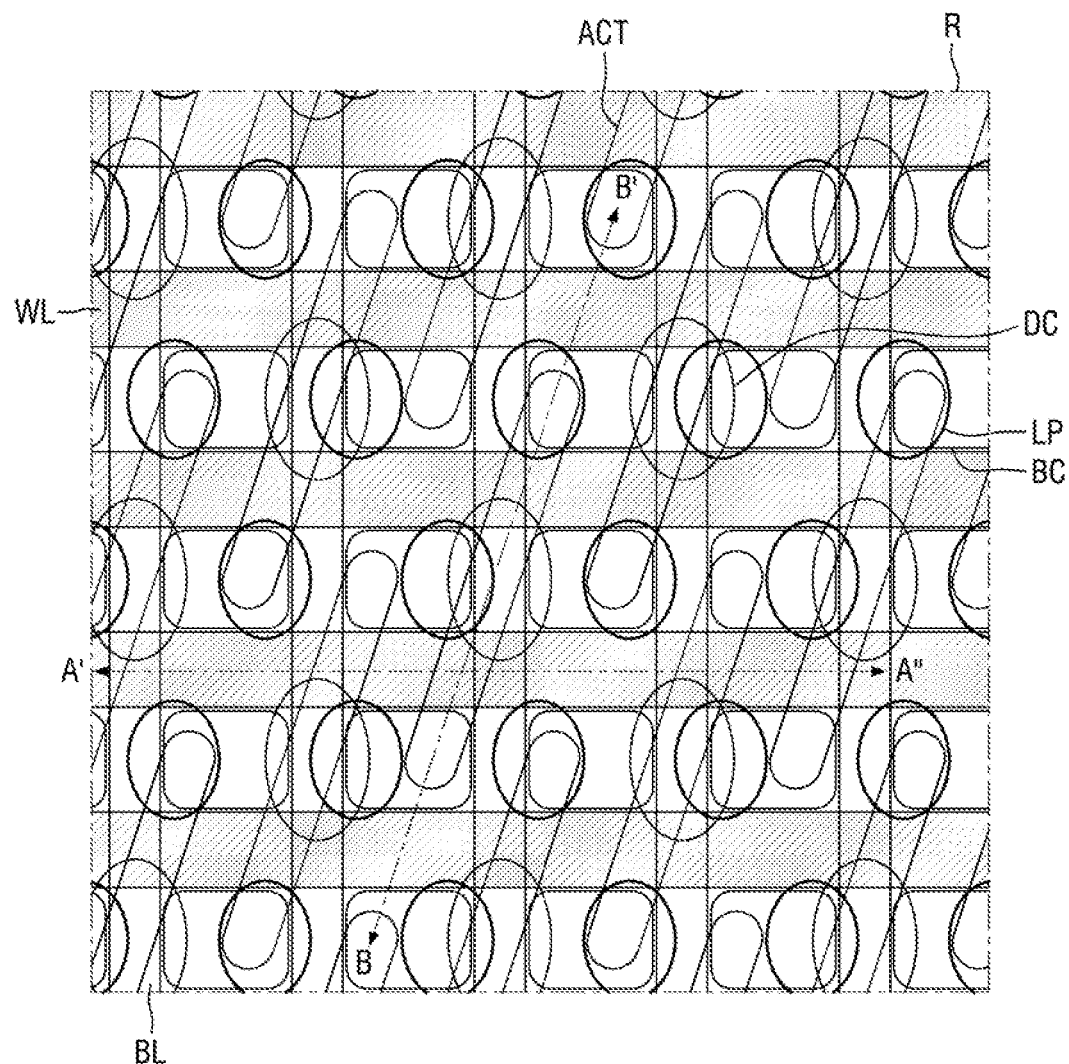
FIG. 2 is an enlarged plan view illustrating a region R of FIG. 1 according to an exemplar, embodiment of the present inventive concepts.
Figure 2:
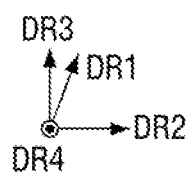

FIG. 1 is a plan layout view of a semiconductor device according to an exemplary embodiment of the present inventive concepts. FIG. 2 is an enlarged plan layout view illustrating a region R of FIG. 1 according to an exemplary embodiment of the present inventive concepts.

Referring to the exemplary embodiments of FIGS. 1 and 2, the semiconductor device according to an exemplary embodiment of the present inventive concepts may include a cell region 10, a cell boundary region 20, and a peripheral region 30.

The cell region 10 may include active regions ACT, wordlines WL, and bitlines BL. In the cell region 10, semiconductor memory devices may be formed on a substrate 100 (see FIG. 3).

Figure 3:
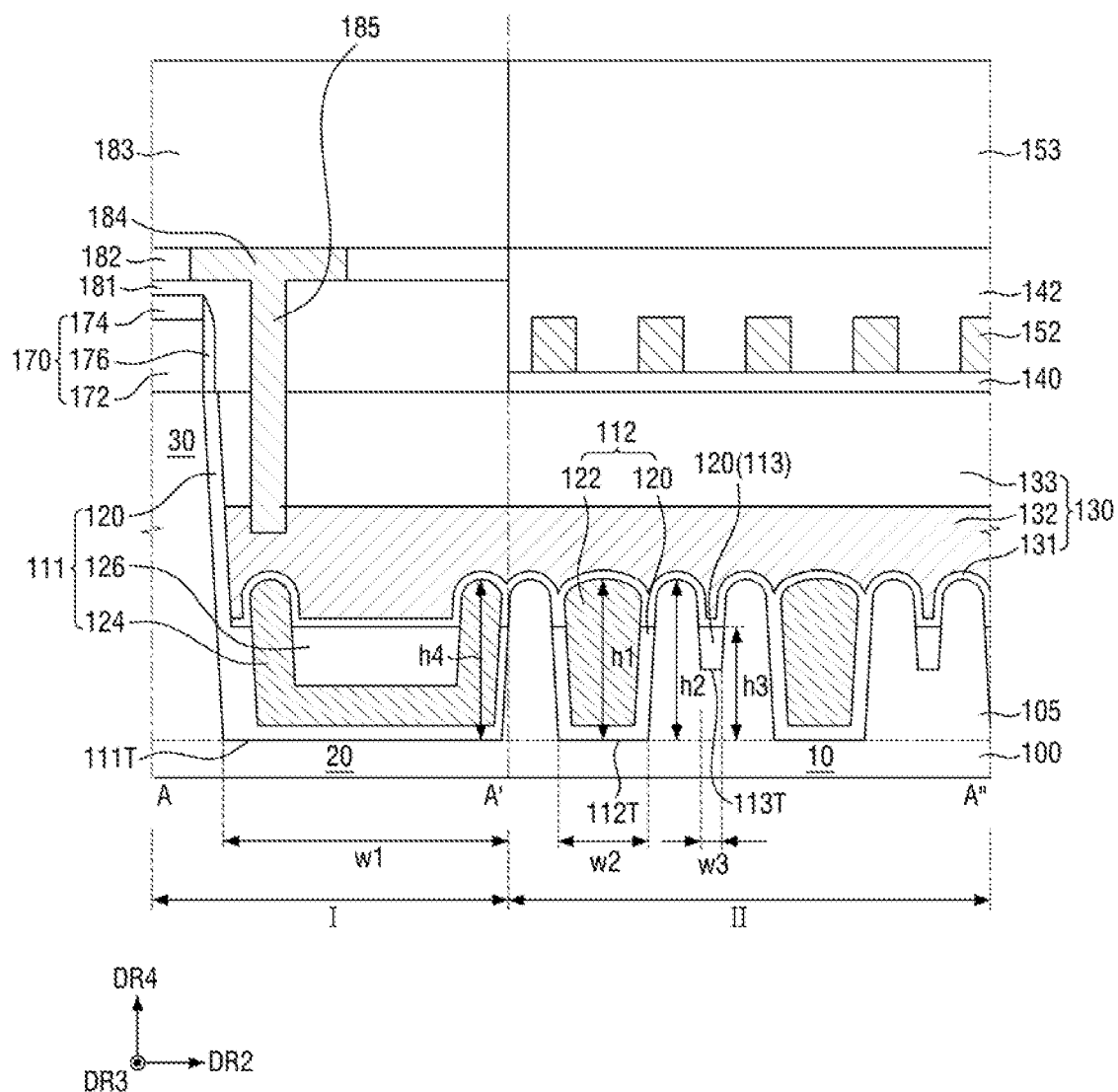
FIG. 3 is a cross-sectional view taken along lines A-A' and A'-A'' of FIGS. 1 and 2 according to an exemplary embodiment of the present inventive concepts.
Figure 4:
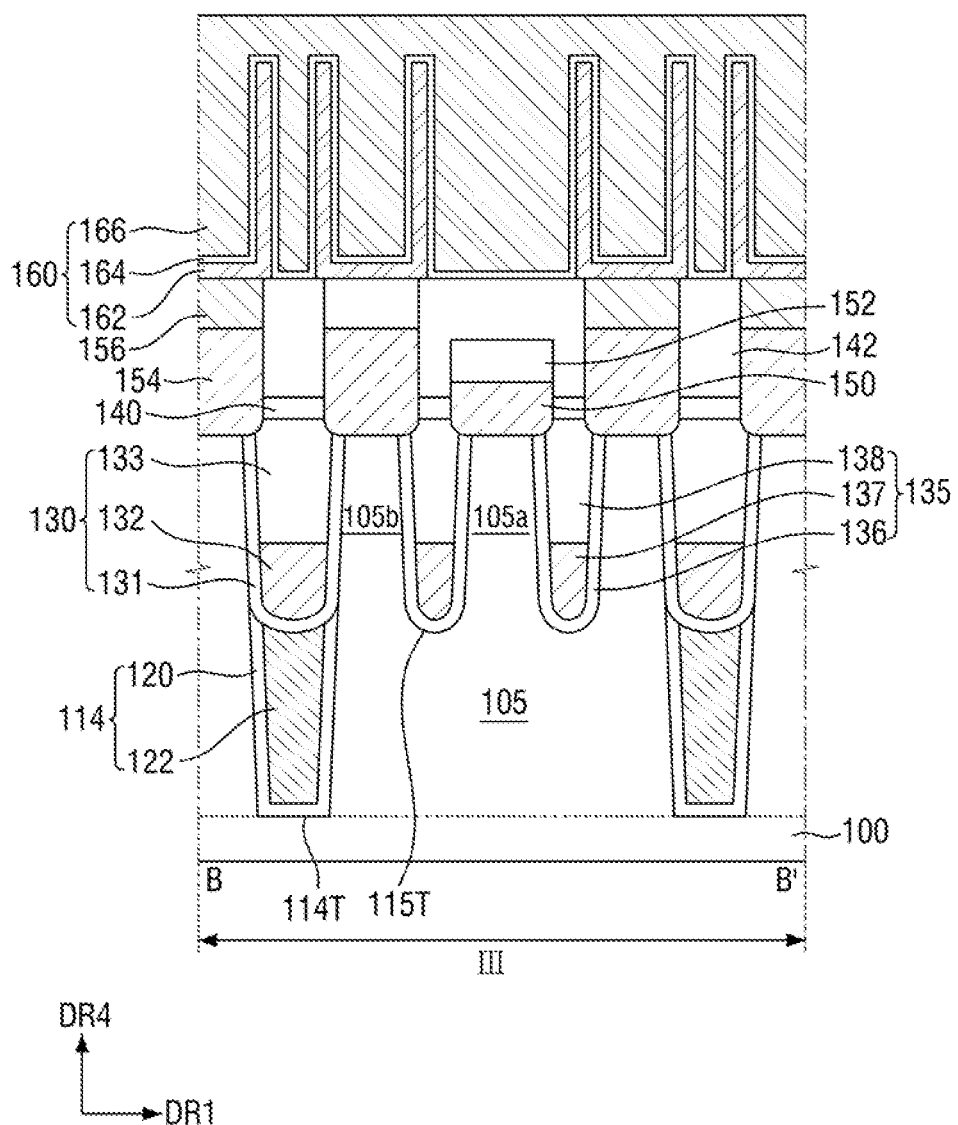
FIG. 4 is a cross-sectional view taken along line B-B' of FIG. 2 according to an exemplary embodiment of the present inventive concepts.

The active regions ACT may be defined by first, second, third and fourth isolation films 111, 112, 113, and 114 (see FIGS. 3-4). As shown in the exemplary embodiment of FIG. 2, the active regions ACT may extend in a first direction DR1 and may be spaced apart in a second direction DR2 and/or a third direction DR3. For example, a plurality of active regions ACT may be formed on the substrate 100 to extend in the first direction DR1.

As shown in the exemplary embodiment of FIG. 2, the active regions ACT may be formed as bars that extend diagonally with respect to the second direction DR2 and the third direction DR3 due to a decrease in the design rule of the semiconductor device according to some exemplary embodiments of the present inventive concepts. For example, the active regions ACT may be formed as bars that extend parallel to one another. The active regions ACT may be arranged in an alternating, staggered relationship in which the center of an active region ACT is disposed adjacent to a lower part of a neighboring active region ACT (e.g., immediately adjacent active regions ACT in the second direction DR2).

The active regions ACT may form source and drain regions through the injection of impurities. For example, in an exemplary embodiment, the injection of impurities may be performed by ion injection. However, exemplary embodiments of the present inventive concepts are not limited thereto.

The wordlines WL may extend in the second direction DR2 across the active regions ACT. The wordlines WL may be arranged such that two wordlines WL pass through one active region ACT. However, exemplary embodiments of the present inventive concepts are not limited thereto. A plurality of wordlines WL may extend in parallel to one another. The wordlines WL may be arranged at regular intervals of a predetermined distance. The width (e.g., length in the third direction DR3) of the word lines WL, and the distance (e.g., in the third direction DR3) between adjacent wordlines WL may be determined based on the design rule of the semiconductor device according to an exemplary embodiment of the present inventive concepts.

The bitlines BL may extend in the third direction DR3 to cross the wordlines WL at right angles. A plurality of bitlines BL may extend in parallel to one another. The bitlines BL may be arranged at regular intervals of a predetermined distance. The width of the bitlines BL (e.g., length in the second direction DR2), and the distance (e.g., in the second direction DR2) between, adjacent bitlines BL may be determined based on the design rule of the semiconductor device according to an exemplary embodiment of the present inventive concepts.

The semiconductor device according to an exemplary embodiment of the present inventive concepts may include various contact arrangements on the active regions ACT. The various contact arrangements may include, for example, direct contacts DC, buried contacts BC, and landing pads LP. However, exemplary embodiments of the present inventive concepts are not limited thereto.

The direct contacts DC may be disposed at the centers of the respective active regions ACT. The direct contacts DC may be contacts that electrically connect the active regions ACT and the bitlines BL.

The buried contacts BC may be disposed at both ends of the respective active regions ACT (e.g., lateral ends in the first direction DR1). The buried contacts BC may be disposed between pairs of adjacent bitlines BC. The buried contacts 154 may be contacts that connect the active regions ACT and the lower electrodes of capacitors.

The landing pads LP may be disposed between the active regions ACT and the buried contacts BC or between the buried contacts BC and the lower electrodes of the capacitors. The landing pads LP increase the contact areas of the buried contacts BC and the active regions ACT, and as a result, the contact resistances between the active regions ACT and the lower electrodes of the capacitors is reduced.

The wordlines WL may be formed to be buried in the active regions ACT. The wordlines WL may be disposed to extend across the active regions ACT between the direct contacts DC or between the buried contacts BC.

The cell boundary region 20 may be formed along the boundaries of the cell region 10. For example, as shown in the exemplary embodiment of FIG. 1, the cell boundary region 20 may surround the cell region 10 in the second direction DR2 and the third direction DR3. However, exemplary embodiments of the present inventive concepts are of limited thereto. The cell boundary region 20 may separate the cell region 10 and the peripheral region 30. As shown in the exemplary embodiment of FIG. 1, the peripheral region 30 may surround the cell boundary region 20 in the second direction DR2 and the third direction DR3. However, exemplary embodiments of the present inventive concepts are not limited thereto.

The peripheral region 30 may be a region where peripheral circuits for driving semiconductor memory devices formed in the cell region 10 are disposed.

FIG. 3 is a cross-sectional view taken along lines A-A' and A'-A" of FIGS. 1 and 2. FIG. 4 is a cross-sectional view taken along line B-B' of FIG. 2. Referring to the exemplary embodiments of FIGS. 3 and 4, a first region I is a region including the peripheral region 30 and the cell boundary region 20, and second and third regions II and III are regions including the cell region 10.

Referring to the exemplary embodiments of FIGS. 1 through 4, the semiconductor device according to an exemplary embodiment of the present inventive concepts may include the substrate 100, first, second, third, and fourth isolation films 111, 112, 113, and 114, first gate patterns 130, second gate patterns 135, bitlines 152, and a capacitor structure 160.

In an exemplary embodiment, the substrate 100 may be a bulk silicon substrate or a silicon-on-insulator (SOI) substrate. However, exemplary embodiments of the present inventive concepts are not limited thereto. For example, in another exemplary embodiment, the substrate 100 may be a silicon substrate or may include another material such as at least one material selected from silicon germanium, a silicon germanium-on-insulator (SGOI), indium antimonide, a lead tellurium compound, indium arsenide, indium phosphide, gallium arsenide, gallium antimonide, etc. For convenience of explanation, the substrate 100 will hereinafter be described as being a silicon substrate.

The first, second, third, and fourth isolation films 111, 112, 113, and 114 may be formed in the substrate 100. The first, second, third, and fourth isolation films 111, 112, 113, and 114 may have a shallow trench isolation (STI) structure with excellent isolation characteristics. The first, second, third, and fourth isolation films 111, 112, 113, and 114 may define active regions 105 in the substrate 100. The active regions 105 may be in the shape of elongated islands having a relatively short axis and a relatively long axis, as illustrated in FIG. 2. The active regions 105 may have an oblique shape which have an angle of less than 90 degrees with respect to the wordlines WL of FIG. 2 which extend in the second direction DR2. The wordlines WL are formed on the first, second, third, and fourth isolation films 111, 112, 113, and 114. The active regions 105 may also have an oblique shape to have an angle of less than 90 degrees with respect to the bitlines 152 which are firmed on the first, second, third, and fourth isolation films 111, 112, 113, and 114 and which extend in the third direction DR3. For example, the active regions 105 may extend in the first direction DR1 which has a predetermined oblique angle with respect to the second and/or third direction DR2 or DR3. In an exemplary embodiment, the first, second, third, and fourth isolation films 111, 112, 112, and 114, which have an STI structure, may also be formed in the cell boundary region 20.

As shown in the exemplary embodiment of FIG. 3, the first isolation film 111 may be formed on the cell boundary region 20. The first isolation film 111 may be formed between the cell region 10 and the peripheral region 30 to define the cell region 10 and the peripheral region 30. The first isolation film 111 may fill a first trench 111T, which is formed in the substrate 100. The first trench 111T may have a first width w1 (e.g., length in the second direction DR2).

As shown in the exemplary embodiment of FIG. 3, the first isolation film 111 may include a first oxide film 120, a second filling film 124, and a second oxide film 126.

The first oxide film 120 may extend along the bottom surface, and portions of the sidewalls, of the first trench 111T. The second filling film 124 may be disposed on the first oxide film 120. The second oxide film 126 may be disposed on a lower portion and sidewalls of the second filling film 124.

In an exemplary embodiment, at least one of the first oxide film 120, the second filling film 124, and the second oxide film 126 may be formed of different materials. For example, in an exemplary embodiment, the first oxide film 120 may include a silicon oxide film. The second oxide film 126 may include the same material as the first oxide film 120. For example, the second oxide film 126 may also include a silicon oxide film. The second filling film 124 may be formed of a different material than the first oxide film 120 and second oxide film 126.

Two adjacent active regions 105 that are spaced apart in the second direction DR2 by as much as a second width w2 may form a single active region pair below a wordline WL, and a plurality of active region pairs may be disposed to be spaced apart by as much as a third width w3 that extends in the second direction DR2. For example, the second width w2 may be greater than the third width w3 and the second width w2 may be smaller than the first width w1.

The second isolation film 112 may define the two active regions 105 that are spaced apart in the second direction DR2 by as much as the second width w2. The second isolation film 112 may fill second trenches 112T, which are formed in the substrate 100. Accordingly, the second trenches 112T may have the second width w2 in the second direction DR2.

The second isolation film 112 may include the first oxide film 120 and a first filling film 122.

The first oxide film 120 may extend along the bottom surface, and portions of the sidewalls, of each of the second trenches 112T. The first filling film may be disposed on the first oxide film 120 in the second trenches 112T.

In an exemplary embodiment, the first and second filling films 122 and 124 may include at least one material selected from semiconductor material and a metal, such as a metal oxide. The first and second filling films 122 and 124 may include silicon. For example, the first and second filling films 122 and 124 may include amorphous silicon or amorphous silicon doped with n- or p-type impurities. However, exemplary embodiments of the present inventive concepts are not limited thereto. In another exemplary embodiment, the first and second filling films 122 and 124 may include at least one compound selected from $Al_2O_3$, $HfO_2$, $TiO_2$, $GeO_2$, $ZrO_2$, $MgO$, $BeO_2$ and $NbO_2$. However, exemplary embodiments of the present inventive concepts are not limited thereto. In an exemplary embodiment, the second filling film 124 may include the same material as the first filling film 122. However, exemplary embodiments of the present inventive concepts are not limited thereto.

Since the first and second filling films 122 and 124 have a different etching ratio from the first oxide film 120 and/or the second oxide film 126 and from the substrate 100, the uppermost surfaces of the first and second filling films 122 and 124 may be higher than the uppermost surfaces of the first and second oxide films 120 and 126. As shown in the exemplary embodiment of FIG. 3, the uppermost surface of the second filling film 124 may have a fourth height h4 with respect to the bottom surface of the first trench 111T. The uppermost surface of the first filling film 122 may have a first height h1 with respect to the bottom surfaces of the second trenches 112T. As shown in the exemplary embodiment of FIG. 3, the level of the bottom surfaces of the second trenches 112T (e.g., distance in the fourth direction DR4 from a surface of the substrate 100) may be the same as the level of the bottom surface of the first trench 111T. Therefore, the first and fourth heights h1 and h4 may be the same.

The third isolation film 113 may define two active regions 105 that are spaced apart in the second direction DR2 by as much as the third width w3. The third isolation film 113 may fill third trenches 113T, which are formed in the substrate 100. The third trenches 113T may have the third width w3 in the second direction DR2.

The two active regions 105 defined by the third isolation film 113 may have a second height h2 (e.g., in the fourth direction DR4) with respect to the bottom surfaces of the second trenches 112T. For example, the first height h1 may be the same as, or smaller than, the second height h2.

In an exemplary embodiment, the third isolation film 113 may include the first oxide film 120. The uppermost surface of the first oxide film 120 of the third isolation film 113 may have the third height h3 with respect to the bottom surfaces of the second trenches 112T. For example, the third height h3 may be smaller than the first and second heights h1 and h2.

Active regions 105 that extend in the first direction DR1 may be arranged at regular intervals of a predetermined distance in the first direction DR1. The fourth isolation film 114 may define two active regions 105 that are spaced apart in the first direction DR1 by a predetermined distance. The fourth isolation film 114 may fill fourth trenches 114T, which are formed in the substrate 100. The fourth trenches 114T may be formed at regular intervals of a predetermined distance in the first direction DR1. The bottom surfaces, in the fourth direction DR4, of the fourth trenches 114T may be on the same level as the bottom surfaces, in the fourth of direction DR4, of the second trenches 112T.

The fourth isolation film 114 may include the first oxide film 120 and the first filling film 122.

In comparative embodiments, as the integration density of the semiconductor device increases, two active regions 105 defined by the second isolation film 112 may be disposed adjacent to each other and may be affected by each other due to a strong electric field being generated therebetween. However, in exemplary embodiments of the present inventive concepts, since in a region between the two adjacent active regions 105 defined by the second isolation film 112, the uppermost surface of the first filling film 122 falls between the uppermost surface of the first oxide film 120 and the uppermost surfaces of the two active regions 105 defined by the second isolation film 112, even the two active regions 105 defined by the second isolation film 112 may not be affected by each other. Accordingly, a semiconductor device with improved reliability and performance can be provided.

As shown in the exemplary embodiments of FIGS. 3-4, the first gate patterns 130 may be formed on the first, second, third, and fourth isolation films 111, 112, 113, and 114 and on the active regions 105. The second gate patterns 135 may be formed in gate trenches 115T, which are formed in the active regions 105. The first gate patterns 130 and the second gate patterns 135 may extend in the second direction DR2. The first gate patterns 130 are illustrated as being disposed on the fourth isolation film 114 in the third region III. However, exemplary embodiments of the present inventive concepts are not limited thereto. For example, in another exemplary embodiment, the first gate patterns 130 may be disposed in the fourth isolation film 114. For example, gate trenches that are the same as the gate trenches 115T may be formed in the fourth isolation film 114 so that the sidewalls of each of the first gate patterns 130 may not be disposed above, or be coplanar with, the sidewalls of each of the fourth trenches 114T.

Each of the first gate patterns 130 may include a first gate dielectric film 131, a first gate electrode 132, and a first gate capping pattern 133. Each of the second gate patterns 135 may include a second gate dielectric film 136, a second gate electrode 137, and a second gate capping pattern 138.

The first gate dielectric film 131 may extend along the first, second, and third isolation films 111, 112, and 113 and along the active regions 105. The first gate dielectric film 131 may extend along the sidewalls of each of the fourth trenches 114T and along the top surface of the fourth isolation film 114. The second gate dielectric film 136 may extend along portions of the sidewalls and the bottom surface of each of the gate trenches 115T. In the exemplary embodiment shown in FIG. 4, the first gate dielectric film 131 extends along the sidewalls of each of the fourth trenches 114T, and the second gate dielectric film 136 extends along the sidewalls of each of the gate trenches 115T. However, exemplary embodiments of the present inventive concepts are not limited thereto. For example, the first gate dielectric film 131 may extend along partial portions of the sidewalls of each of the fourth trenches 114T, and the second gate dielectric film 136 may extend along partial portions of the sidewalls of each of the gate trenches 115T.

In an exemplary embodiment, the first and second gate dielectric films 131 and 136 may include at least one compound selected from silicon oxide, silicon nitride, silicon oxynitride, or a high-k material having a greater dielectric constant than silicon oxide. For example, the high-k material may include at least one compound selected from hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Alternatively, the high-k material may include a nitride and/or an oxynitride of a metallic material such as hafnium. For example, the high-k material may include hafnium nitride and/or hafnium oxynitride. However, exemplary embodiments of the present inventive concepts are not limited thereto.

The first and second gate electrodes 132 and 137 may be disposed on the first and second gate dielectric films 131 and 136, respectively. The second gate electrode 137 may fill a portion of the gate trench 115T. The first and second gate electrodes 132 and 137 may correspond to wordlines WL (see FIG. 2).

Since the first gate electrode 132 is disposed on the fourth isolation film 114, the lowermost surfaces, in the fourth direction DR4, of the first and second gate electrodes 132 and 137 may be on the same level (e.g., distance from a surface of the substrate 100 in the fourth direction DR4), and the heights of the first and second gate electrodes 132 and 137 may be substantially the same.

In an exemplary embodiment, the first and second gate electrodes 132 and 137 may include at least one compound selected from titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbon-nitride (TiAlC—N), titanium aluminum carbide (TiAlC), titanium carbide (TiC), tantalum carbon nitride (TaCN), tungsten (W), aluminum (Al), copper (Cu), cobalt (Co), titanium (Ti), tantalum (Ta), nickel (Ni), platinum (Pt), nickel-platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), and vanadium (V).

In an exemplary embodiment, the first and second gate electrodes 132 and 137 may include a conductive metal oxide or a conductive metal oxynitride, or an oxidized form of of any one of the aforementioned metallic materials.

The first and second gate capping patterns 133 and 138 may be disposed on the first and second gate electrodes 132 and 137, respectively. For example, a lower surface of the first and second gate capping patterns 133 and 138 may directly contact an upper surface of the first and second gate electrodes 132 and 137, respectively. The first gate capping pattern 133 may fill an upper portion of a fourth trench 114T that remains unfilled by the first gate electrode 132, and the second gate capping pattern 138 may fill an upper portion of the gate trench 115T that remains unfilled by the second gate electrode 137. In an exemplary embodiment, the first and second gate capping patterns 133 and 138 may include at least one compound selected from silicon nitride (SiN), silicon oxynitride (SiON), oxide (SiO2), silicon oxynitride (SiCN), silicon oxycarbonitride (SiOCN), and a combination thereof.

First and second interlayer insulating films 140 and 142 may be sequentially stacked on the substrate 100 above the first gate pattern 130 and second gate pattern 135. While the exemplary embodiments of FIGS. 3-4 show only two interlayer insulating films comprising the first and second interlayer insulating films 140 and 142 as being formed on the substrate 100, exemplary embodiments of the present inventive concepts are not limited thereto. For example, in other exemplary embodiments, three or more interlayer insulating films may be formed on the substrate 100.

In an exemplary embodiment, the first and second interlayer insulating films 140 and 142 may include at least one compound selected from silicon oxide, silicon nitride, and silicon oxynitride. However, exemplary embodiments of the present inventive concepts are not limited thereto.

As shown in the exemplary embodiment of FIG. 4, direct contacts 450 may be connected to first source/drain regions 105a. For example, the direct contacts 150 may be connected to the first source/drain regions 105a through the first interlayer insulating film 140.

Buried contacts 154 may be connected to second source/drain regions 105b. For example, the buried contacts 154 may be connected to the second source/drain regions 105b through the first and second interlayer insulating films 140 and 142.

Landing pads 156 may be formed on the buried contacts 154 and may be electrically connected to the buried contacts 154. For example, as shown in the exemplary embodiment of FIG. 4, a lower surface of the landing pads 156 may directly contact an upper surface of the buried contacts 154.

The direct contacts 150, the buried contacts 154, and the landing pads 156 may include a conductive material and may be single-layer films including a single conductive material or multilayer films including different types of conductive materials. In an exemplary embodiment, the direct contacts 150, the buried contacts 154, and the landing pads 156 may include at least one of compound selected from a semiconductor material doped with impurities, a conductive silicide compound, a conductive metal nitride, and a metal. However, exemplary embodiments of the present inventive concepts are not limited thereto.

The bitlines 152 may be formed on the direct contacts 150 and may be connected to the direct contacts 150. For example, as shown in the exemplary embodiment of FIG. 4, lower surfaces of the bitlines 152 may directly contact upper surfaces of the direct contacts 150. Thus, the bitlines 152 may be electrically connected to the first source/drain regions 105a.

The capacitor structure 160 may be formed on the landing pads 156 to be connected to the landing pads 156 and may be electrically connected to the second source/drain regions 105b. In an exemplary embodiment, the capacitor structure 160 may include lower electrodes 162, a capacitor dielectric film 164, and an upper electrode 165. The capacitor structure 160 may store electric charge in the capacitor dielectric film 164 by using the difference in electric potential between the lower electrodes 162 and the upper electrode 166.

A peripheral gate pattern 170 may be formed on the peripheral region 30. The peripheral gate pattern 170 may include a peripheral gate electrode 172, a peripheral gate capping pattern 174, and a peripheral gate spacer 176. As shown in the exemplary embodiment of FIG. 3, the peripheral gate capping pattern 174 may be disposed on the peripheral gate electrode 172 and a lower surface, of the peripheral gate capping pattern 174 directly contacts an upper surface of the peripheral gate electrode 172. The peripheral gate spacer 175 is disposed on lateral side surfaces of the peripheral gate electrode 172 and the peripheral gate capping pattern 174. In an exemplary embodiment, the peripheral gate pattern 170 may further include a peripheral gate dielectric film.

First, second, and third peripheral interlayer insulating films 181, 182, and 183 may be sequentially stacked on the peripheral gate pattern 170 and on the first gate patterns 130, on the first region I. While the exemplary embodiment shown in FIG. 3 includes only three peripheral interlayer insulating films, exemplary embodiments of the present inventive concepts are not limited thereto and the number of the peripheral interlayer insulating films may vary. For example, four or more peripheral interlayer insulating films may be formed.

A connecting wire 184 may be disposed in the second peripheral interlayer insulating film 182. The connecting wire 184 may be connected to the first gate patterns 130 via a gate pattern contact 185. The gate pattern contact 185 may be formed in the cell boundary region 20. In an exemplary embodiment, the connecting wire 184 and the gate pattern contact 185 may include at least one material selected from a conductive metal nitride and a metal.

Figure 5:
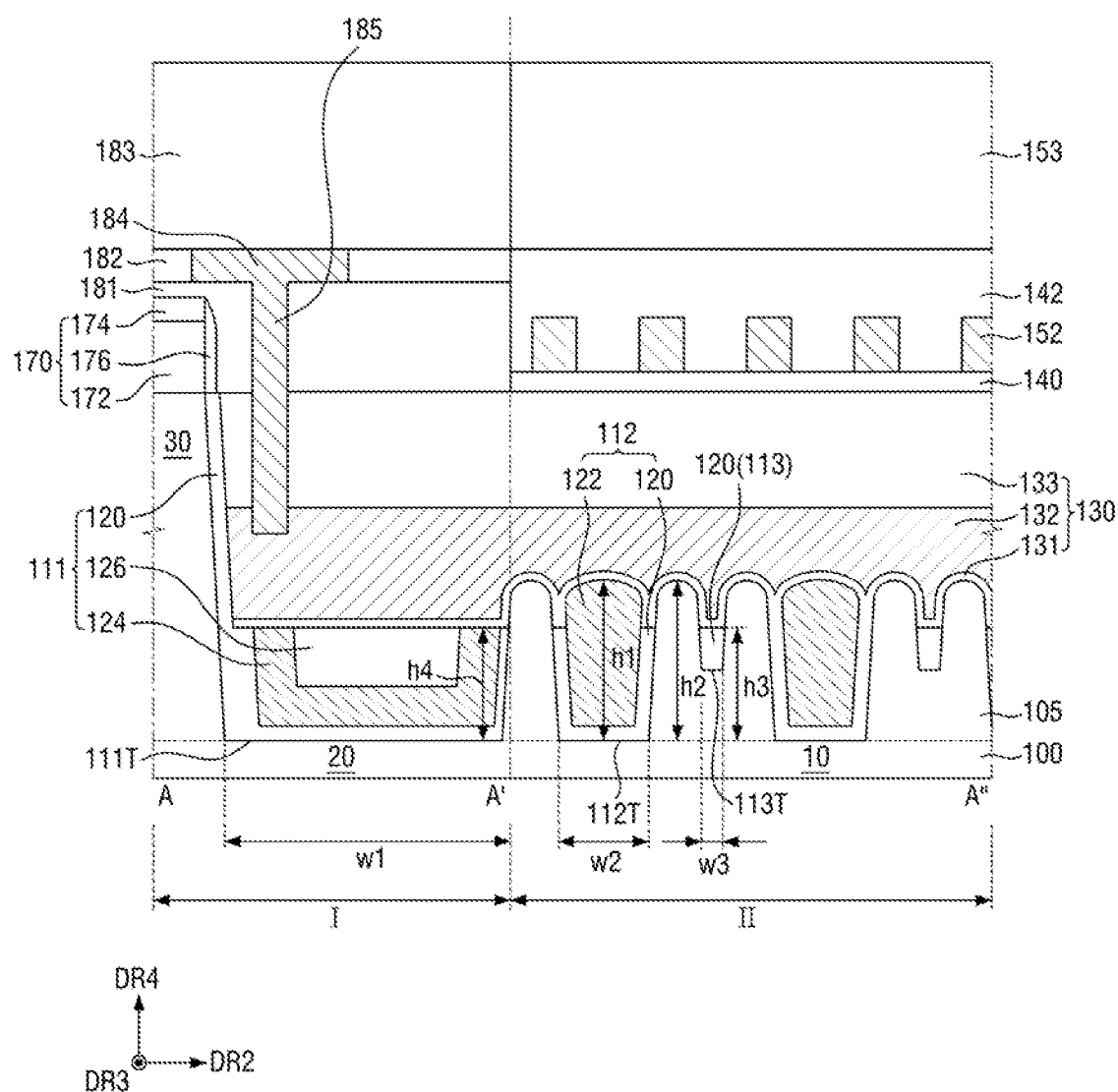
FIG. 5 is a cross-sectional view of a semiconductor device, taken along lines A-A' and A'-A'' of FIGS. 1 and 2, according to an exemplary embodiment of the present inventive concepts.
Figure 6A:
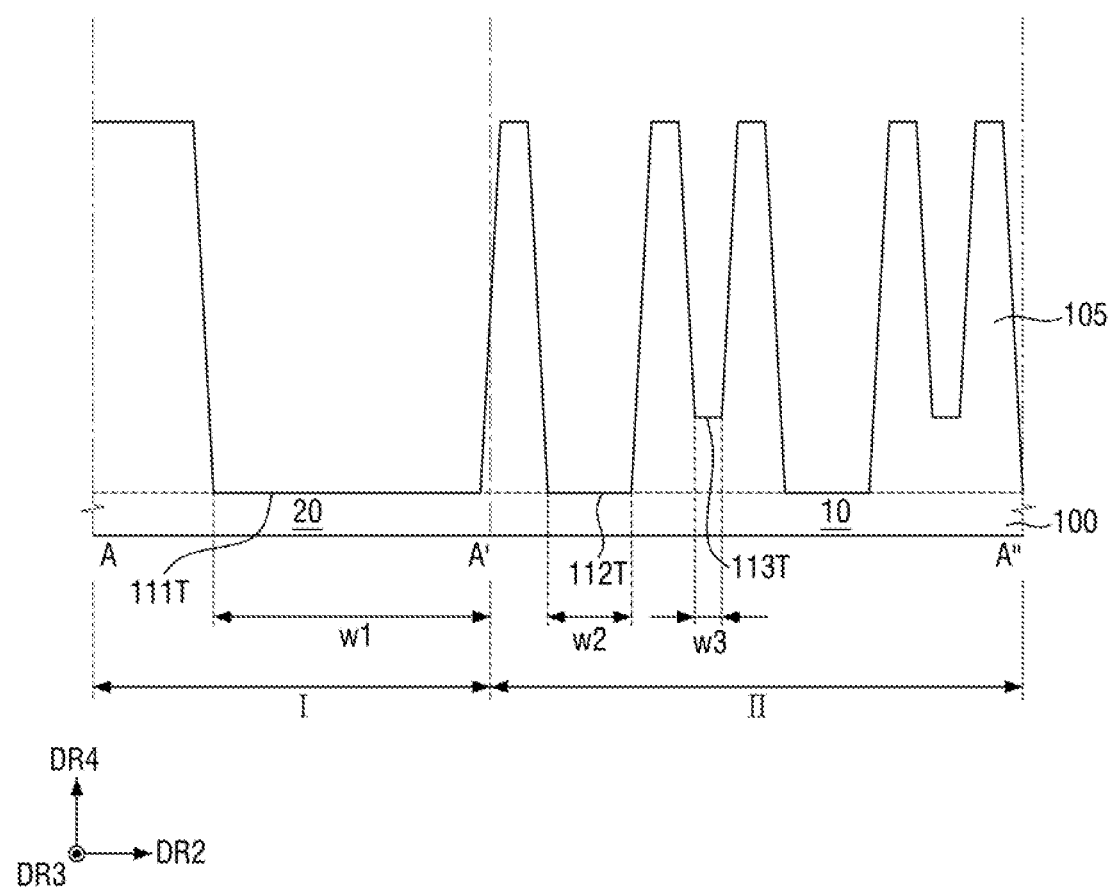
FIGS. 6A through 11B are cross-sectional views of a method of fabricating a semiconductor device taken along lines A-A' and A'-A" of FIGS. 1 and 2 according to exemplary embodiments of the present inventive concepts.
Figure 6B:
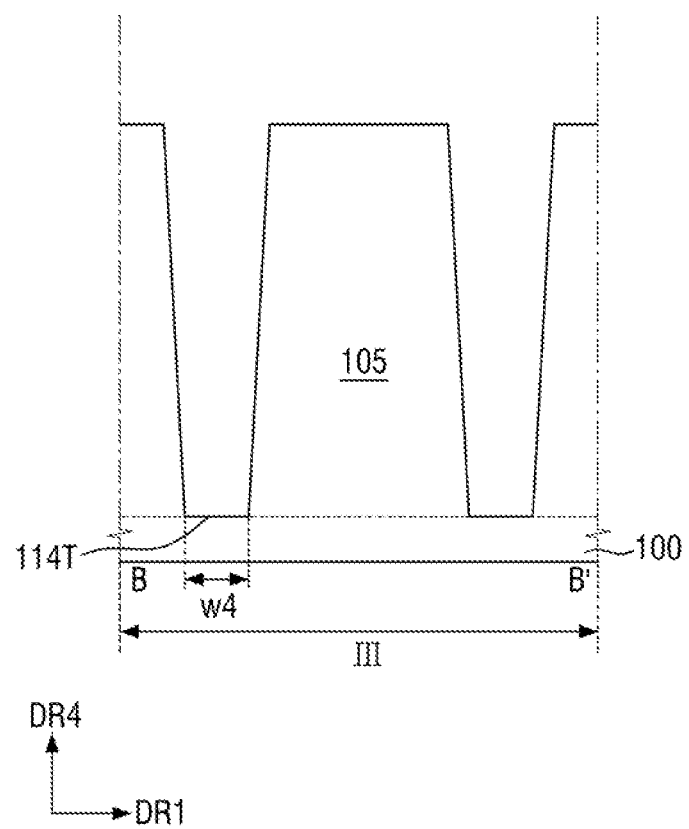
Figure 7A:
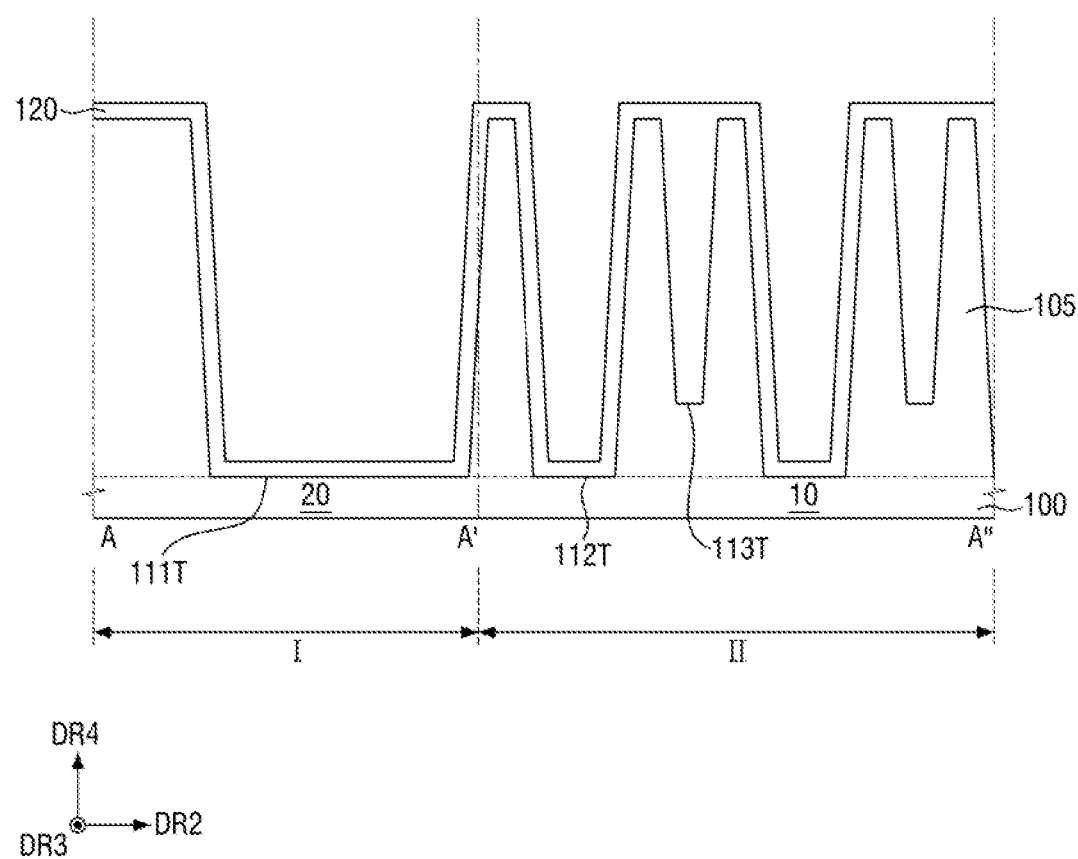
Figure 7B:
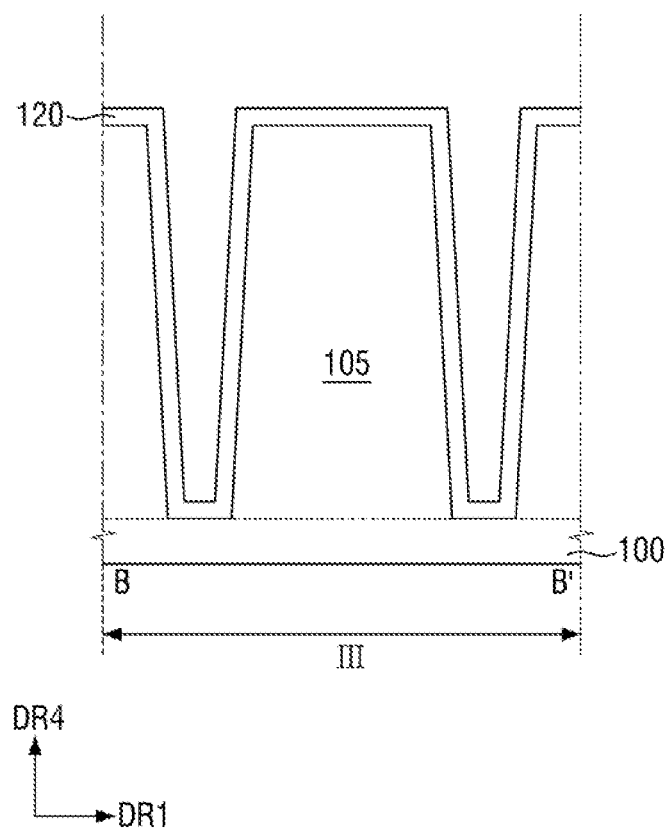
Figure 8A:
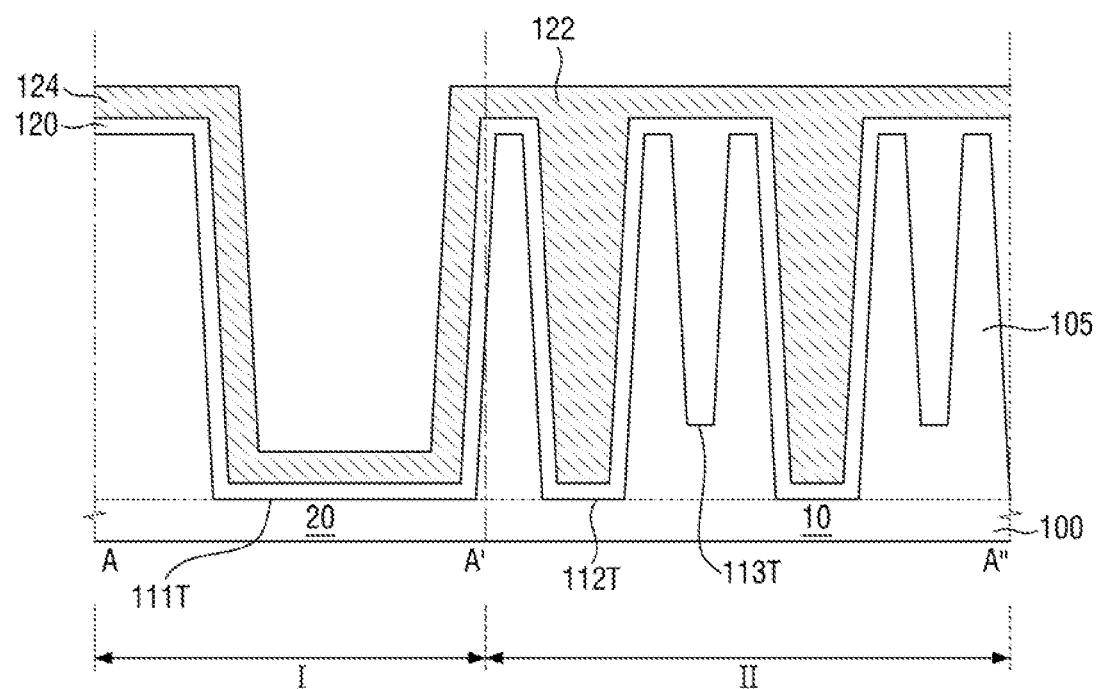
Figure 8B:
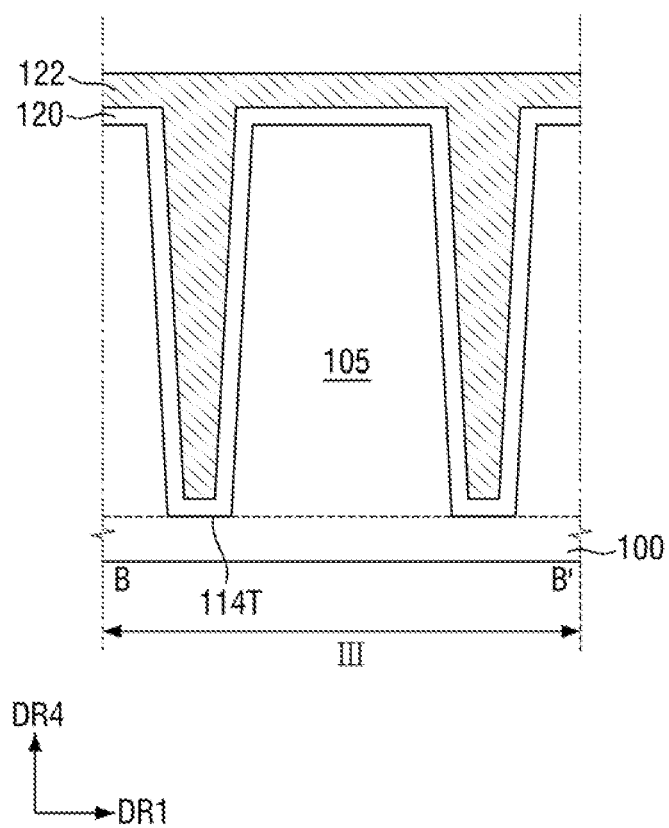
Figure 9A:
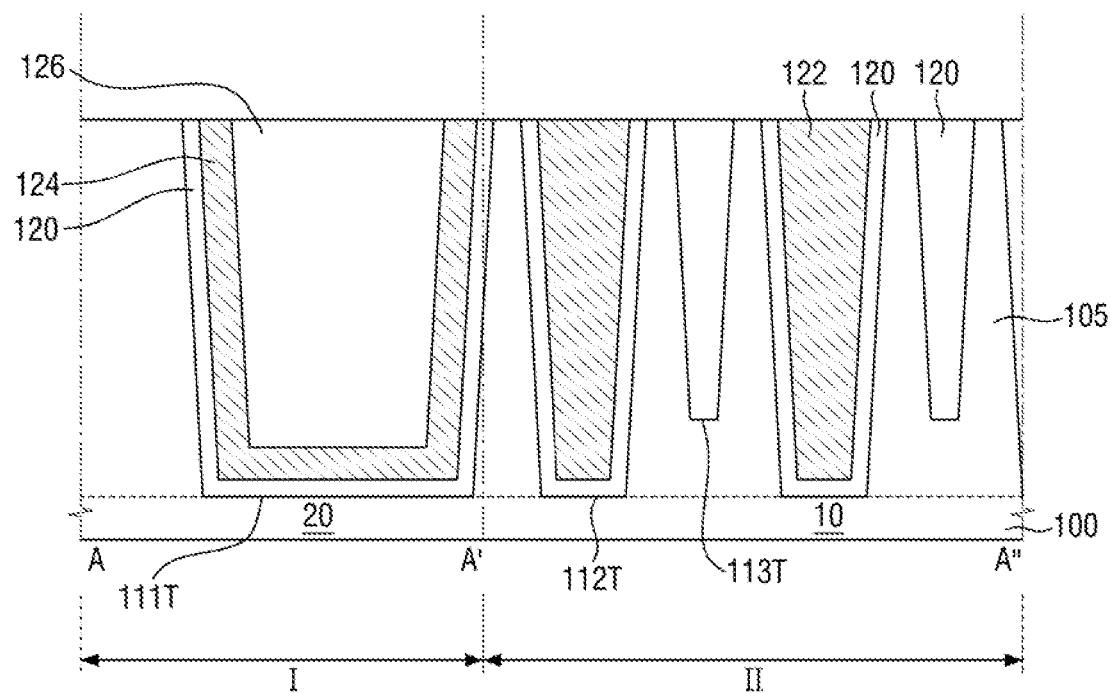
Figure 9B:
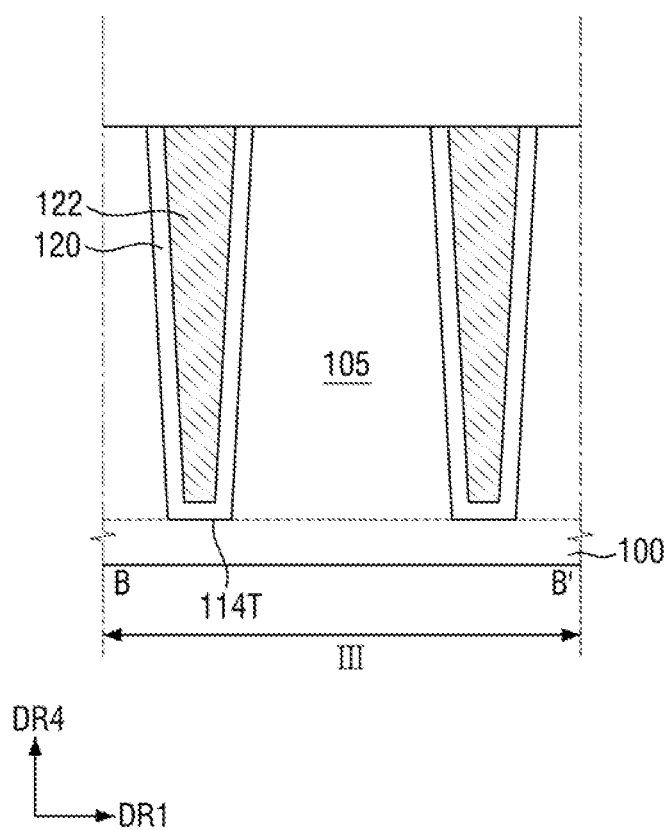

FIG. 5 is a cross-sectional view, taken along lines A-A' and A'-A" of FIGS. 1 and 2, of a semiconductor device according to another exemplary embodiment of the present disclosure. The semiconductor device of FIG. 5 will hereinafter be described, focusing mainly on the differences with the semiconductor device of the exemplary embodiment of FIG. 3. Therefore, a duplicative description of identical elements will not be included for convenience of explanation.

Referring to the exemplary embodiments of FIGS. 1, 2, and 5, the semiconductor device of FIG. 5 may include a substrate 100, first, second, third, and fourth isolation films 111, 112, 113, and 114, first gate patterns 130, second gate patterns 135, bitlines 152, and a capacitor structure 160.

The first isolation film 111 may include a first oxide film 120, a second filling film 124, and a second oxide film 126. In an exemplary embodiment, the second filling, film 124 may include silicon nitride or silicon oxynitride.

The uppermost surfaces of the first oxide film 120 of the second isolation film 112, the second filling film 124, and the second oxide film 126 may be on the same level (e.g., distance from a surface of the substrate 100 in the fourth direction DR4). The uppermost surface of the second filling film 124 may have a fourth height h4 with respect to the bottom surfaces of the first trench 111T.

The second isolation film 112 may include the first oxide film 120 and the first filling film 122. In an exemplary embodiment, the first filling film 122 may include at least one material selected from a semiconductor material and a metal, such as a metal oxide. For example, the first filling film 122 may include amorphous silicon or amorphous silicon doped with n- or p-type impurities. However, exemplary embodiments of the present inventive concepts are not limited thereto. In another exemplary embodiment, the first film 122 may include at least one compound selected from $Al_2O_3$, $HfO_2$, $TiO_2$, $GeO_2$, $ZrO_2$, MgO, $BeO_2$ and $NbO_2$. However, exemplary embodiments of the present inventive concepts are not limited thereto. In the exemplary embodiment of FIG. 5, the first and second filling films 122 and 124 may include different materials.

Accordingly, the fourth height 114 may be smaller than a first height h1 of the first filling film 122 with respect to the bottom surfaces of the second trenches 112T unlike the exemplary embodiment of FIG. 3. The fourth height h4 may be substantially the same as a third height h3 of the uppermost surface of the first oxide film 120 of the second isolation film 112 with respect to the bottom surfaces of the second trenches 112T.

The exemplary embodiments of FIGS. 6A through 11B are cross-sectional views illustrating a method of fabricating a semiconductor device according to exemplary embodiments of the present inventive concepts.

Referring to the exemplary embodiments of FIGS. 1, 2, 6A, and 6B, a first trench 111T, second trenches 112T, third trenches 113T, and fourth trenches 114T may be formed on a substrate 100 to define active regions 105. A first trench 111T having a first width w1 may be formed in a cell boundary region 20, and second trenches 112T having a second width w2, third trenches 113T having a third width w3, and fourth trenches 114T having a fourth width w4 may be formed in a cell region 10. The third trenches 113T may be formed to be shallower in a fourth direction DR4 than the first trench 111T, the second trenches 112T, and the fourth trenches 114T. For example, a level of the bottom surface of the third trenches 113T may be higher than the level of the bottom surfaces of the first trench 111T, the second trenches 112T and the fourth trenches 114T.

Thereafter, referring to the exemplary embodiments of FIGS. 1, 2, 7A, and 7B, a first oxide film 120 may be formed in the first, second, third and fourth trenches 111T, 112T, 113T, and 114T and on the active regions 105. The first oxide film 120 may be formed conformally on the first, second, third and fourth trenches 111T, 112T, 113T, and 114T. In contrast, as shown in the exemplary embodiment of FIG. 7A, the first oxide film 120 may completely fill the third trenches 113T. In an exemplary embodiment, the first oxide film 120 may be formed by chemical vapor deposition (CVD) or atomic layer deposition (ALD). However, exemplary embodiments of the present inventive concepts are not limited thereto.

Referring to the exemplary embodiments of FIGS. 1, 2, 8A, and 8B, a filling film may be formed on the first oxide film 120. The filling film forms the second filling film 124 in the first region I and forms the first filling film 122 in the second region II. The second filling film 124 may be formed conformally on the first oxide film 120 in the first trench 111T. In contrast, as shown in the exemplary embodiment of FIG. 8A, the first filling film 122 may completely fill the second and fourth trenches 112T and 114T. In an exemplary embodiment, the film forming the first filling film 122 and second filling film 124 may include at least one material selected from a semiconductor material film, such as a silicon film and a metal oxide.

Referring to the exemplary embodiments of FIGS. 1, 2, 9A, and 9B, a second oxide film 126 may be formed. The second oxide film 126 may be formed on the second filling film 124.

The second oxide film 126 may completely fill the first trench 111T. In an exemplary embodiment, the second oxide film 126 may include the same material as the first oxide film 120.

Referring to the exemplary embodiments of FIGS. 1, 2, 10A, and 10B, the substrate 100 may be partially recessed. The substrate 100 may have a second height h2. The second filling film 124 may have the fourth height h4 in the first trench 111T with respect to the bottom surface of the first trench 111T. The first filling film 122 may have the first height h1 in the second trenches 112T with respect to the bottom surfaces of the second trenches 112T. The first oxide film 120 may have the third height h3 in the third trenches 113T with respect to the bottom surfaces of the second trenches 112T. The bottom surfaces of the second trenches 112T and the first trench 111T may be on the same level. Since both the first and second filling films 122 and 124 are formed from the same filling film and may include the same material, such as a silicon film or a metal oxide, the first and fourth heights h1 and h4 may be substantially the same. The first and fourth heights h1 and h4 may be substantially the same as the second height h2 or may be smaller than the second height h2. The first and fourth heights h1 and h4 may be greater than the third height h3. The first filling film 122 may have a protruding fin structure that protrudes in the fourth direction DR4 from the substrate 100.

Figure 10A:
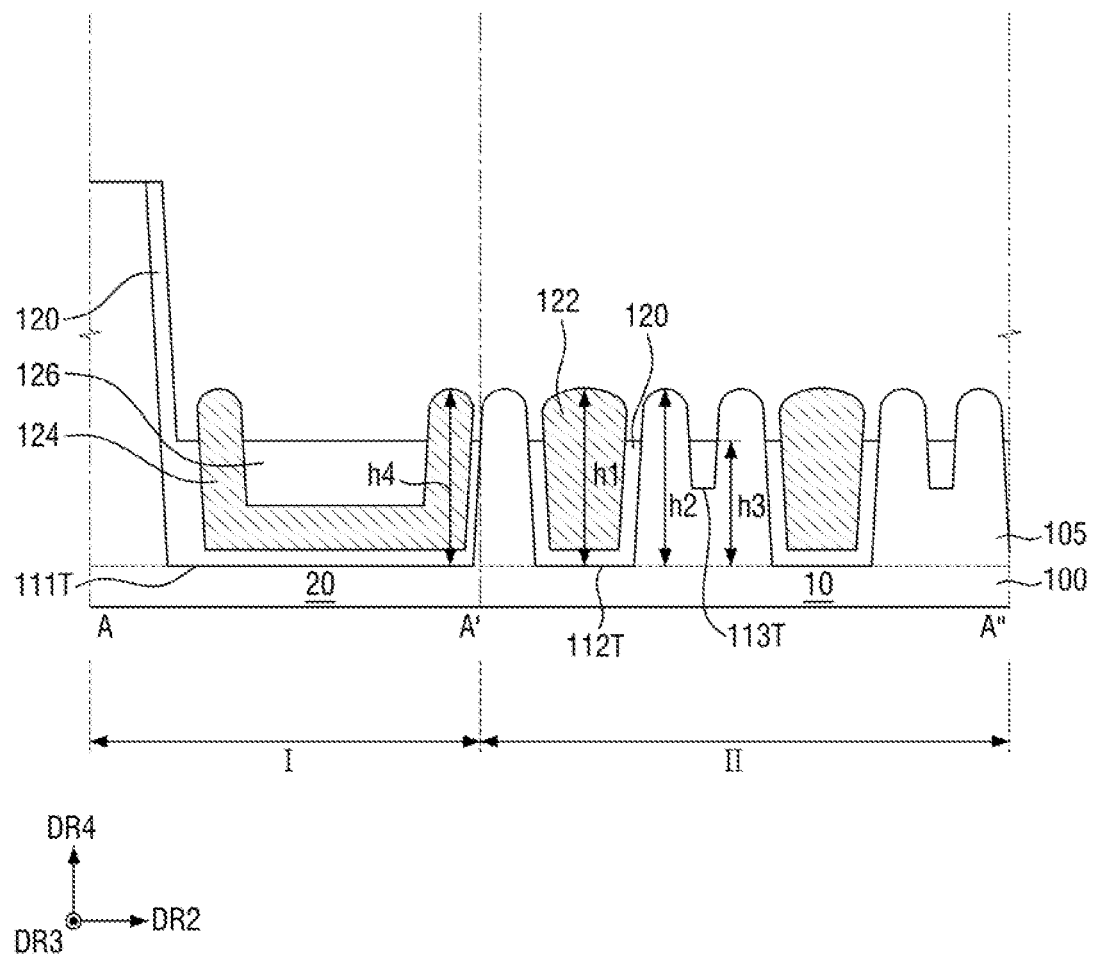
Figure 10B:
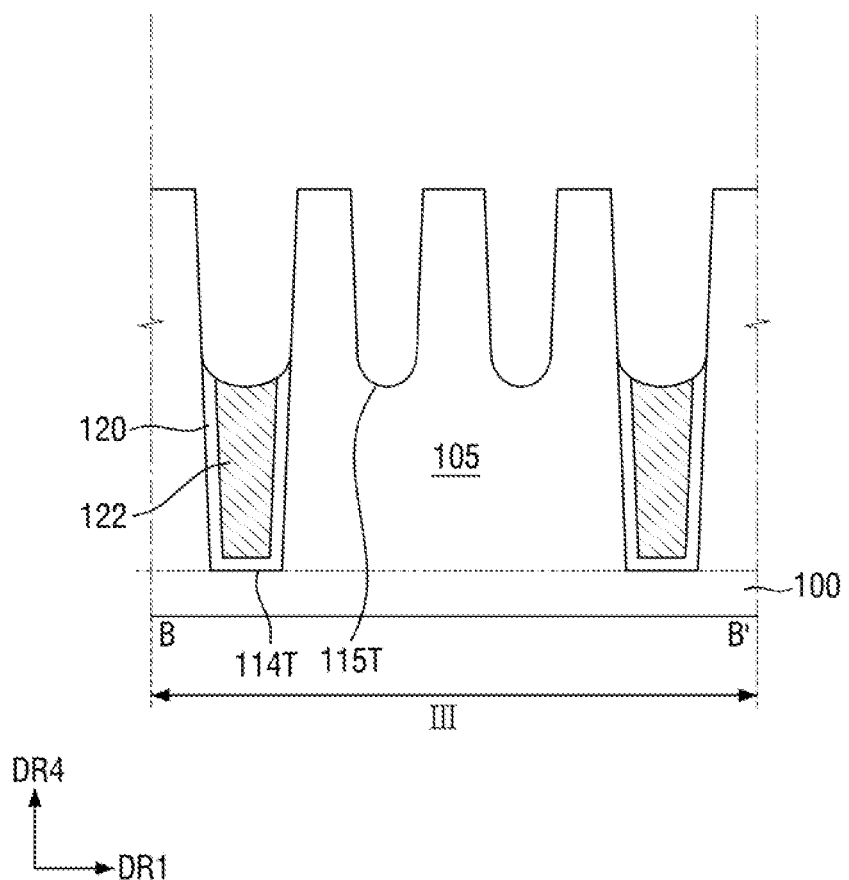
Figure 11A:
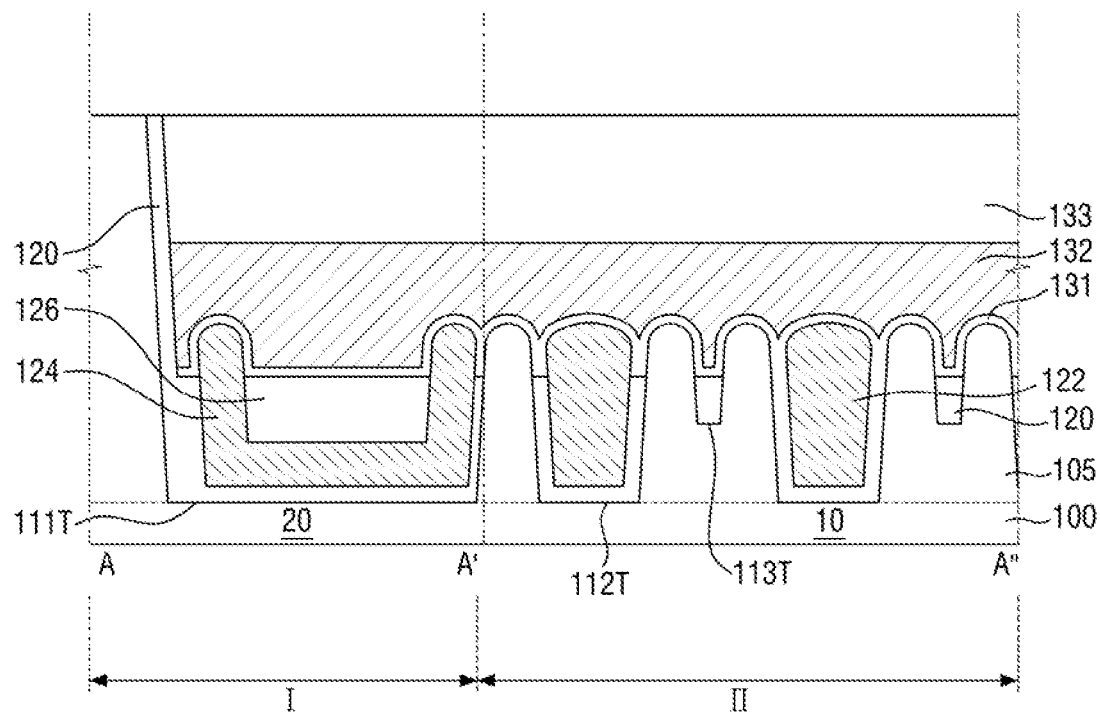
Figure 11A:
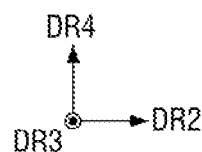
Figure 11B:
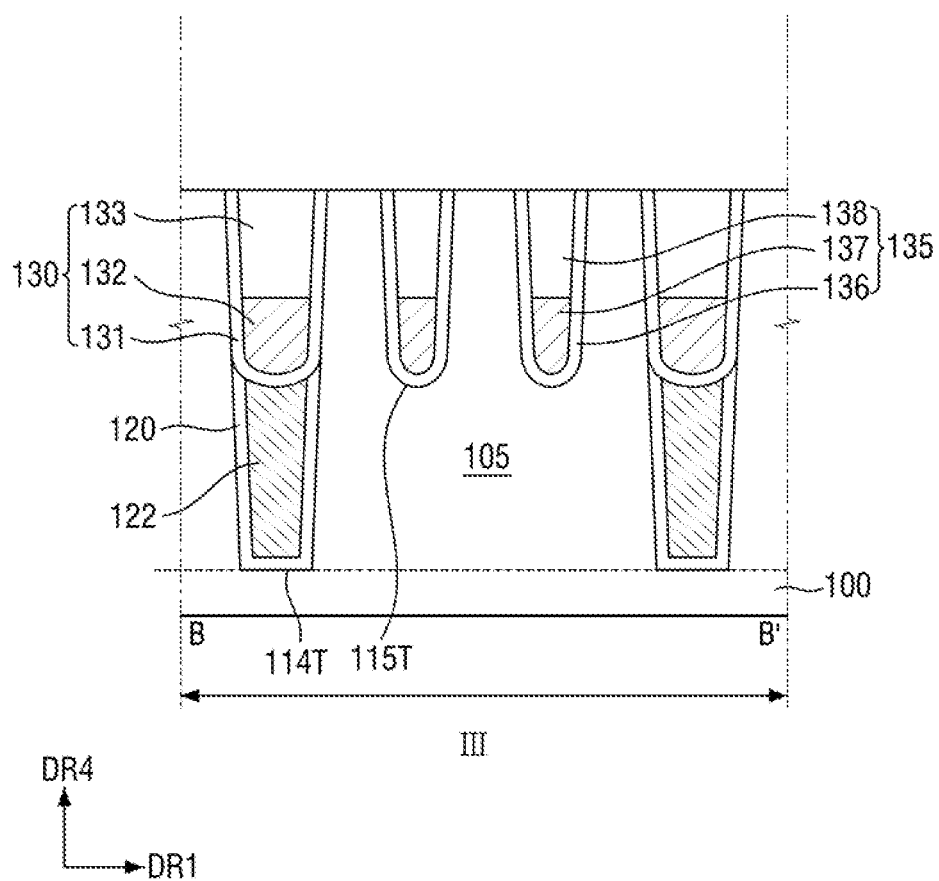

As shown in the exemplary embodiment of FIG. 10B, gate trenches 115T may be formed on the active regions 105. Trenches that are the same as the gate trenches 115T may also be formed on the first oxide film 120 and the first filling film 122 in the fourth trenches 114T. The sidewalls of each of the trenches that are formed on the first oxide film 120 and the first filling film 122 in the fourth trenches 114T may be aligned with the sidewalls of a respective fourth trench 114T. However, exemplary embodiments of the present inventive concepts are not limited thereto. For example, in another exemplary embodiment, the sidewalls of each of the trenches that are formed on the first oxide film 120 and the first filling film 122 in the fourth trenches 114T may be on the inside of the sidewalls of the respective fourth trench 114T and the sidewalls of the fourth trench 114T and the trenches formed on the first oxide film 120 and the first filling film 122 may not be coplanar.

Thereafter, referring to the exemplary embodiments of FIGS. 1, 2, 11A, and 11B, first gate patterns 130 and second gate patterns 135 may be formed.

A first gate dielectric film 131 may be formed conformally on the first trench 111T, the second trenches 112T, the third trenches 113T, and the fourth trenches 114T. A second gate dielectric film 136 may be formed conformally along the bottom surface and the sidewalls of each of the gate trenches 115T.

A first gate electrode 132 and a first gate capping pattern 133 may be sequentially formed on the first gate dielectric film 131. The first gate electrode 132 may fill portions of the fourth trenches 114T. A second gate electrode 137 may fill portions of the gate trenches 115T. In an exemplary embodiment, the first and second gate electrodes 132 and 137 may be formed to completely fill the fourth trenches 114T and the gate trenches 115T and may then be partially removed by an etch-back process. However, exemplary embodiments of the present inventive concepts are not limited thereto. Thereafter, the fourth trenches 114T and the gate trenches 115T may be completely filled with the first gate capping pattern 133 and a second gate capping pattern 138, respectively.

Figure 12A:
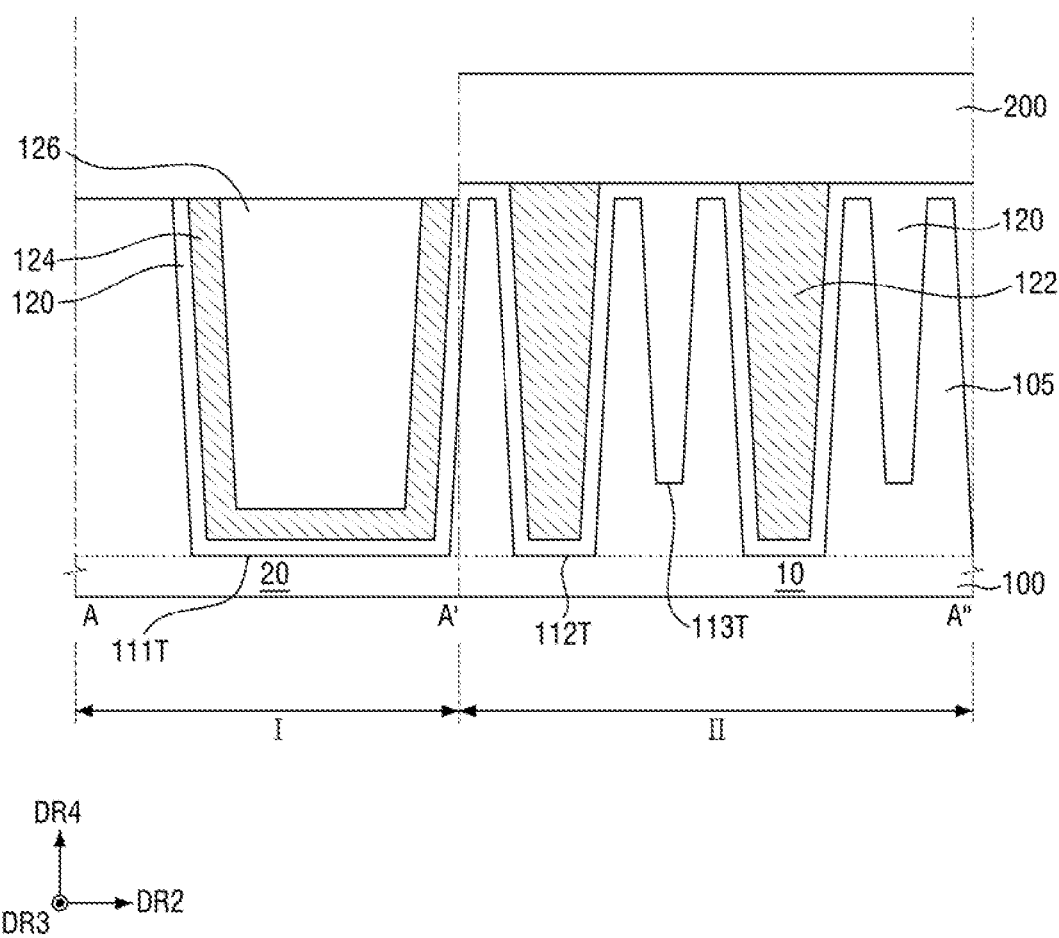
FIGS. 12A and 12B are cross-sectional views illustrating a method of fabricating a semiconductor device taken along lines A-A' and A'-A" of FIGS. 1 and 2 according to exemplary embodiments of the present inventive concepts.
Figure 12B:
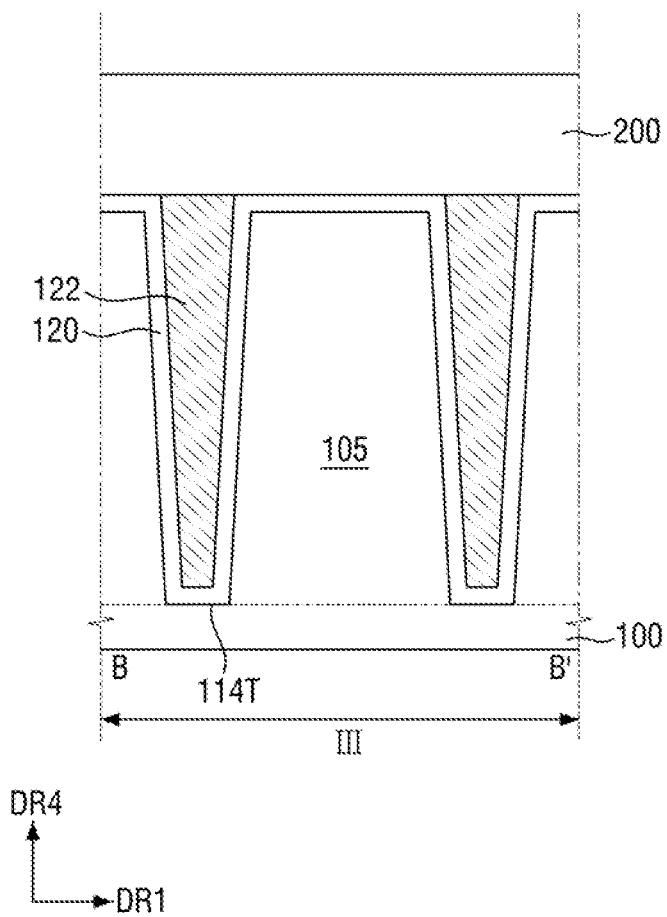

FIGS. 12A and 12B are cross-sectional views illustrating a method of fabricating a semiconductor device according to other exemplary embodiments of the present inventive concepts. FIGS. 12A and 12B illustrate steps performed after the steps illustrated in FIGS. 8A and 8B.

Referring to the exemplary embodiments of FIGS. 1, 2, 12A, and 12B, the second filling film 124 and the first oxide film 120 may be removed from above the first trench 111T. During the removal of the second filling film 124, an upper surface of the first filling film 122 on second trenches 112T and fourth trenches 114T may be removed, and a first oxide film 120 may be exposed on the third trenches 113T. After the removal of the second filling film 124, a cell buffer 200 may be formed in second and third regions II and III, which account for a cell region. In an exemplary embodiment, the first filling film 122 may include at least one material selected from a silicon or a metal oxide.

A second filling film 124 and a second oxide film 126 may then be sequentially formed. The second oxide film 126 may fill part of the first trench 111T that remains unfilled. The second oxide film 126 is illustrated as being a single-layer film. However, exemplary embodiments of the present inventive concepts are not limited thereto. For example, in another exemplary embodiment, the second oxide film 126 may include a multilayer film. In this exemplary embodiment, the second filling film 124 may include, for example, silicon nitride. In this exemplary embodiment, the materials of the first filling film 122 and the second filling film 124 may be different from each other.

Thereafter, portions of the second oxide film 126 and the second filling film 124 may be removed by a planarization process. As a result, the top surface of the second oxide film 126 may be exposed in the first trench 111T.

Thereafter, referring again to the exemplary embodiments of FIGS. 4 and 5, a peripheral gate pattern 170 may be formed in a first region I, and the cell buffer 200 may be removed. Thereafter, first gate patterns 130 and second gate patterns 135 may be formed. Since the first and second filling films 122 and 124 include different materials, the first and fourth heights h1 and h4 may differ from each other. Since the first filling film 122 includes silicon and/or a metal oxide, the first height h1 may be greater than the fourth height h4.

While the present inventive concepts have been shown and described with reference to exemplary embodiments thereof, it will be apparent to those of ordinary skill in the art that various modifications in form and details may be made thereto without departing from the spirit and scope of the present inventive concepts.

What is claimed is:

1. A semiconductor device comprising:
a substrate including isolation films and active regions that are defined by the isolation films, the active regions extending in a first direction;
a first trench disposed on the substrate;
second trenches and third trenches disposed in the active regions;
an oxide film and a filling film disposed in the first trench, the filling film is disposed on the oxide film in the first trench;
the third trenches are filled only with the oxide film, wherein an uppermost surface of the oxide film in the third trench is lower than an uppermost surface of the filling film in the first trench;
first gate patterns disposed on the filling film in the first trench; and
second gate patterns disposed in the second trenches, the second gate patterns extending in a second direction, that is different from the first direction,
wherein the filling film includes at least one material selected from a semiconductor material film and a metal.

2. The semiconductor device of claim 1, Wherein the filling film includes a silicon film.

3. The semiconductor device of claim 2, wherein the silicon film includes silicon doped with impurities.

4. The semiconductor device of claim 2, wherein the silicon film includes amorphous silicon.

5. The semiconductor device of claim 1, wherein the filling film includes a metal oxide.

6. The semiconductor device of claim 1, wherein the oxide film is disposed along sidewalls and a bottom surface of the first trench.

7. The semiconductor device of claim 1, wherein lowermost surfaces of the first gate patterns are at a substantially same level as lowermost surfaces of the second gate patterns in a thickness direction of the substrate.

8. A semiconductor device comprising:
a first trench disposed in a substrate and having a first width in a first direction;
second trenches disposed in the substrate and having a second width in the first direction, the second width is smaller than the first width;
third trenches disposed in the substrate and having a third width in the first direction, the third width is smaller than the second width;
a first isolation film filling the first trench;
a second isolation film filling the second trenches, the second isolation film including at least one material selected from a semiconductor material film and a metal, wherein an uppermost surface of the second isolation film has a first height with respect to a bottom surface of the second isolation film;
a third isolation film filling the third trenches, wherein an uppermost surface of the third isolation film has a third height with respect to a bottom surface of the second isolation film;
an uppermost surface of a portion of the substrate between the second isolation film and the third isolation film has a second height with respect to the bottom surface of the second isolation film; and
wordlines extending in the first direction over the second and third isolation films and extending at least partially over the first isolation film;
wherein the first height is less than or equal to the second height and the first height is greater than the third height.

9. The semiconductor device of claim 8, wherein:
the substrate includes a cell region;
the second isolation film and the third isolation film are disposed in the cell region; and
the first isolation film is disposed on a periphery of the cell region to define the cell region.

10. The semiconductor device of claim 8, wherein the second isolation film includes a plurality of second isolation films and the third isolation film includes a plurality of third isolation films, the plurality of second isolation films and the plurality of third isolation films are repeatedly arranged in the first direction in a cell region.

11. The semiconductor device of claim 8, wherein the second isolation film includes:
- an oxide film that is disposed along a bottom surface and portions of sidewalls of each of the second trenches; and
- a filling film that is disposed on the oxide film, the filling film including the semiconductor material film and/or the metal.

12. The semiconductor device of claim 11, wherein an uppermost surface of the filling film has a height that is greater than an uppermost surface of the oxide film with respect to the bottom surface of the second isolation film.

13. The semiconductor device of claim 8, wherein the third isolation film fills portions of the third trenches.

14. The semiconductor device of claim 8, wherein the first isolation film includes:
- a first oxide film that is disposed along a bottom surface and sidewalls of the first trench;
- a filling film disposed on the first oxide film, the filling film including silicon or silicon nitride; and
- a second oxide film disposed on the filling film.

15. The semiconductor device of claim 14, wherein;
the filling film includes silicon; and
an uppermost surface of the filling film has the first height with respect to the bottom surface of the second isolation film.

16. The semiconductor device of claim 14, wherein:
the filling film includes silicon nitride; and
an uppermost surface of the filling film has a same height as the uppermost surface of the third isolation film.

17. A semiconductor device comprising:
- a first trench disposed in a substrate and having a first width in a first direction;
- second trenches disposed in the substrate and having a second width in the first direction, the second width is smaller than the first width;
- third trenches disposed in the substrate and having a third width in the first direction, the third width is smaller than the second width;
- a first isolation film filling the first trench;
- a second isolation film filling the second trenches, an uppermost surface of the second isolation film having a first height with respect to a bottom surface of the second isolation film, the first isolation film and second isolation film including different materials from each other;
- a third isolation film filling the third trenches, uppermost surfaces of the first and third isolation films have a third height with respect to the bottom surface of the second isolation film;
- an uppermost surface of a portion of the substrate between the second isolation film and the third isolation film has a second height with respect to the bottom surface of the second isolation film; and
- wordlines extending in the first direction over the second isolation film and the third isolation film and extending in part over the first isolation film;
- wherein the first height is less than or equal to the second height and the first height is greater than the third height.

18. The semiconductor device of claim 17, wherein the second isolation film includes at least one material selected from a semiconductor material film and a metal.

19. The semiconductor device of claim 17, wherein the first isolation film includes:
- an oxide film disposed along a bottom surface and sidewalls of the first trench;
- a filling film disposed on the oxide film and including silicon nitride; and
- a second oxide film disposed on the filling film.

* * * * *